US012096183B2

(12) United States Patent
Chen et al.

(10) Patent No.: US 12,096,183 B2
(45) Date of Patent: Sep. 17, 2024

(54) MEMS STRUCTURE

(71) Applicant: Fortemedia, Inc., Santa Clara, CA (US)

(72) Inventors: Chih-Yuan Chen, Tainan (TW);
Feng-Chia Hsu, Tainan (TW);
Chun-Kai Mao, Tainan (TW);
Jien-Ming Chen, Tainan (TW);
Wen-Shan Lin, Tainan (TW); Nai-Hao Kuo, Tainan (TW)

(73) Assignee: FORTEMEDIA, INC., Alviso, CA (US)

( * ) Notice: Subject to any disclaimer, the term of this patent is extended or adjusted under 35 U.S.C. 154(b) by 155 days.

(21) Appl. No.: 17/820,618

(22) Filed: Aug. 18, 2022

(65) Prior Publication Data

US 2023/0308809 A1 Sep. 28, 2023

Related U.S. Application Data

(60) Provisional application No. 63/323,106, filed on Mar. 24, 2022.

(51) Int. Cl.
*H04R 19/04* (2006.01)
*B81B 3/00* (2006.01)

(52) U.S. Cl.
CPC ............ *H04R 19/04* (2013.01); *B81B 3/007* (2013.01); *B81B 2201/0257* (2013.01); *B81B 2203/0127* (2013.01); *B81B 2203/0307* (2013.01); *H04R 2201/003* (2013.01)

(58) Field of Classification Search
CPC .. H04R 19/04; H04R 2201/003; B81B 3/007; B81B 2201/0257; B81B 2203/0127; B81B 2203/0307
See application file for complete search history.

(56) References Cited

U.S. PATENT DOCUMENTS

| 11,259,106 | B1 * | 2/2022 | Chen | ................. H04R 7/06 |
| 2014/0084396 | A1 * | 3/2014 | Jenkins | ............... H04R 23/006 |
| | | | | 257/419 |

* cited by examiner

*Primary Examiner* — Sunita Joshi
(74) *Attorney, Agent, or Firm* — McClure, Qualey & Rodack, LLP

(57) ABSTRACT

A MEMS structure is provided. The MEMS structure includes a substrate having an opening portion and a backplate disposed on one side of the substrate and having acoustic holes. The MEMS structure also includes a diaphragm disposed between the substrate and the backplate and extending across the opening portion of the substrate. The diaphragm includes a ventilation hole, and an air gap is formed between the diaphragm and the backplate. The MEMS structure further includes a filler structure disposed on the diaphragm, and a portion of the filler structure is disposed in the ventilation hole.

20 Claims, 12 Drawing Sheets

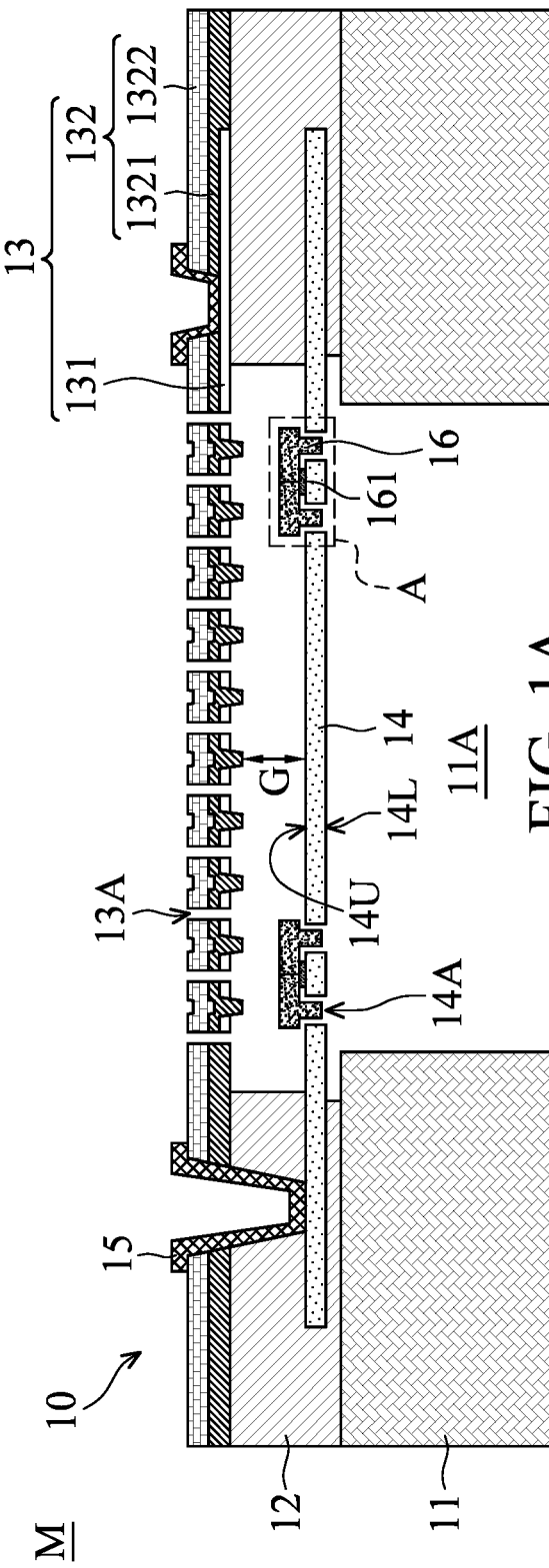
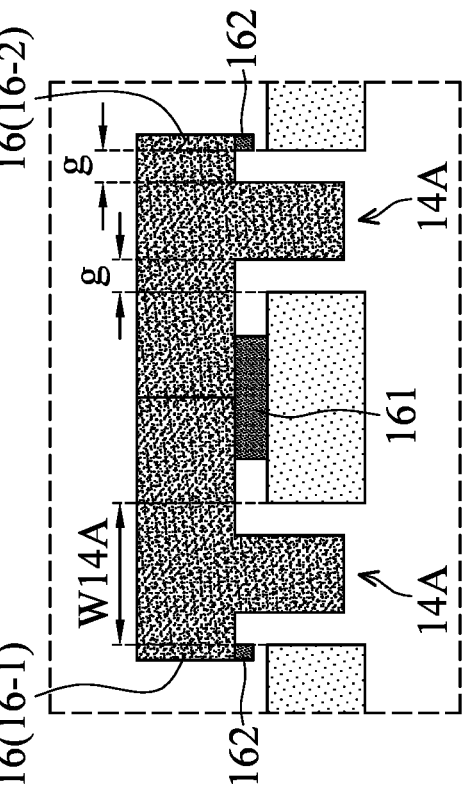
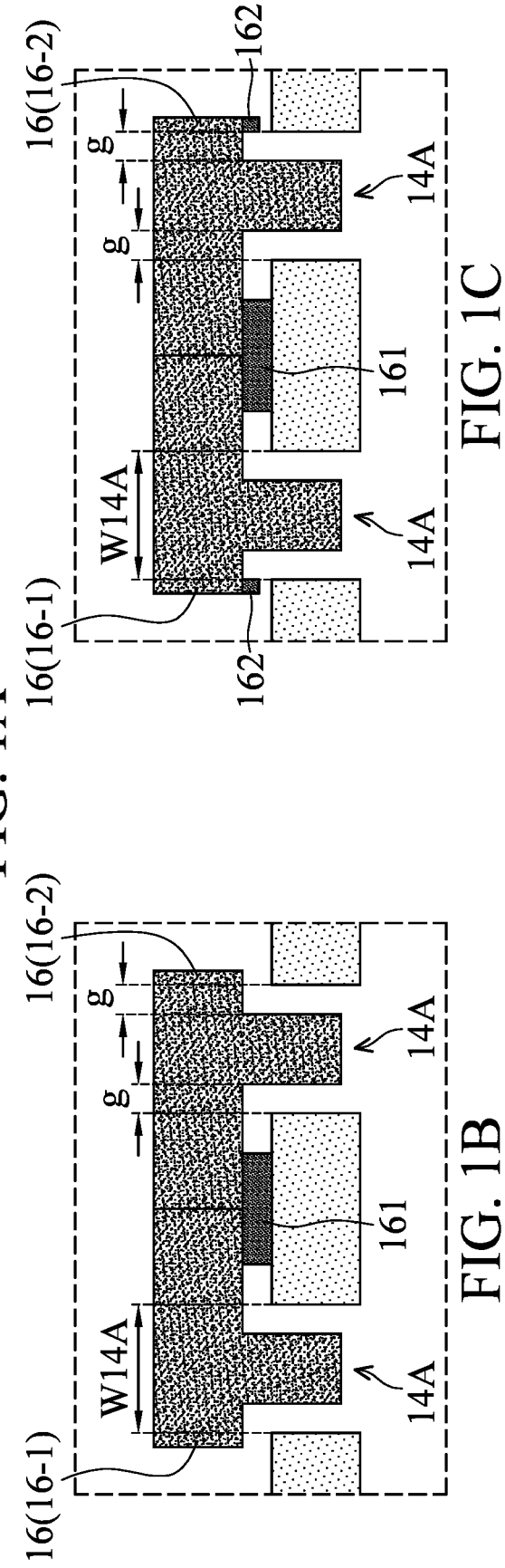
FIG. 1A
FIG. 1B
FIG. 1C

MEMS STRUCTURE

CROSS REFERENCE TO RELATED APPLICATIONS

This application claims the benefit of U.S. Provisional Application No. 63/323,106, filed on Mar. 24, 2022, the entirety of which is incorporated by reference herein.

BACKGROUND

Technical Field

Embodiments of the present disclosure relate in general to an acoustic transducer, and in particular they relate to a micro-electro-mechanical system (MEMS) structure that may be used in a micro-electro-mechanical system microphone.

Description of the Related Art

The current trend in personal electronics is toward fabricating slim, compact, lightweight and high-performance electronic devices, including microphones. A microphone is used to receive sound waves and convert acoustic signals into electric signals. Microphones are widely used in daily life and are installed in such electronic products as telephones, mobiles phones, and recording pens. In a capacitive microphone, variations in acoustic pressure (i.e., local pressure deviation from the ambient atmospheric pressure caused by sound waves) force the diaphragm to deform correspondingly, and the deformation of the diaphragm induces a capacitance variation. The variation of acoustic pressure of the sound waves can thus be obtained by detecting the voltage difference caused by the capacitance variation.

This is distinct from conventional electret condenser microphones (ECM), in which mechanical and electronic elements of micro-electro-mechanical system (MEMS) microphones can be integrated on a semiconductor material using integrated circuit (IC) technology to fabricate a miniature microphone. MEMS microphones have such advantages as a compact size, being lightweight, and having low power consumption, and they have therefore entered the mainstream of miniaturized microphones.

Although existing MEMS microphones have generally been adequate for their intended purposes, they have not been entirely satisfactory in all respects. For example, the specifications of high-end microphones not only include signal-to-noise ratio (SNR) and acoustic overload point (AOP) performance requirements, but also the need to meet low-frequency roll off (LFRO) requirements. In addition, the phase mismatching between different MEMS microphones also needs to be minimized.

SUMMARY

The micro-electro-mechanical system (MEMS) structure in the present disclosure may be used in a micro-electro-mechanical system microphone, which includes a filler structure disposed in the ventilation hole. In some embodiments, a gap is formed between the filler structure and the sidewall of the diaphragm, which may increase the acoustic resistance, thereby enhancing the signal-to-noise ratio (SNR). Furthermore, the smaller gap may reduce the variation size of fabrication, thereby decreasing the phase mismatching between MEMS microphones.

Some embodiments of the present disclosure include a MEMS structure.

The MEMS structure includes a substrate having an opening portion and a backplate disposed on one side of the substrate and having acoustic holes. The MEMS structure also includes a diaphragm disposed between the substrate and the backplate and extending across the opening portion of the substrate. The diaphragm includes a ventilation hole, and an air gap is formed between the diaphragm and the backplate. The MEMS structure further includes a filler structure disposed on the diaphragm, and a portion of the filler structure is disposed in the ventilation hole.

In some embodiments, a gap is formed between the filler structure and the sidewall of the diaphragm.

In some embodiments, the gap is smaller than 0.3 μm.

In some embodiments, the filler structure includes at least two anchor portions disposed on the diaphragm or includes an anchor portion disposed on the backplate.

In some embodiments, the diaphragm includes ventilation holes, from a top view of the diaphragm, the ventilation holes are arranged in a ring shape and surround the center of the diaphragm, and the ventilation holes include outer ventilation holes and inner ventilation holes arranged in a concentric manner.

In some embodiments, the outer ventilation holes and the inner ventilation holes are staggered relative to the center of the diaphragm.

In some embodiments, the anchor portions are disposed between the outer ventilation holes and the inner ventilation holes.

In some embodiments, the anchor portions are disposed inside the inner ventilation holes or outside the outer ventilation holes.

In some embodiments, each outer ventilation hole and each inner ventilation hole are C-shaped, and openings of the outer ventilation holes face away from the center of the diaphragm and openings of the inner ventilation holes face the center of the diaphragm.

In some embodiments, the anchor portions are disposed at the openings of the outer ventilation holes or at the openings of the inner ventilation holes.

In some embodiments, the anchor portions are in direct contact with the upper surface or the lower surface of the diaphragm.

In some embodiments, from a cross-sectional view of the micro-electro-mechanical system structure, the filler structure is divided into filler segments, and two adjacent filler segments share a common anchor portion.

In some embodiments, the common anchor portion is disposed between the two adjacent filler segments.

In some embodiments, the common anchor portion is disposed outside the two adjacent filler segments.

In some embodiments, the filler structure forms a dimple portion towards the diaphragm.

In some embodiments, the MEMS structure further includes a pillar disposed between the backplate and the diaphragm.

In some embodiments, from a top view, the area of the filler structure is larger than the area of the ventilation hole.

Some embodiments of the present disclosure include a MEMS structure.

The MEMS structure includes a substrate having an opening portion and a backplate disposed on one side of the substrate and having acoustic holes. The MEMS structure also includes a diaphragm disposed between the substrate and the backplate and extending across the opening portion of the substrate. The diaphragm includes a ventilation hole, and an air gap is formed between the diaphragm and the backplate. The MEMS structure further includes a filler structure disposed in the ventilation hole and including at least two anchor portions disposed on the diaphragm. The diaphragm has eaves portions from the upper surface of the diaphragm towards the air gap, and the anchor portions connect the filler structure and at least one eaves portion.

In some embodiments, the diaphragm forms a dimple portion towards the filler structure.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1A is a partial cross-sectional view illustrating a micro-electro-mechanical system (MEMS) microphone according to some embodiments of the present disclosure.

FIG. 1B is a partial enlarged view of region A in FIG. 1A, which may show a portion of the diaphragm and a portion of the filler structure.

FIG. 1C is another partial enlarged view of region A in FIG. 1A, which may show a portion of the diaphragm and a portion of the filler structure.

DETAILED DESCRIPTION

Figure 2A:
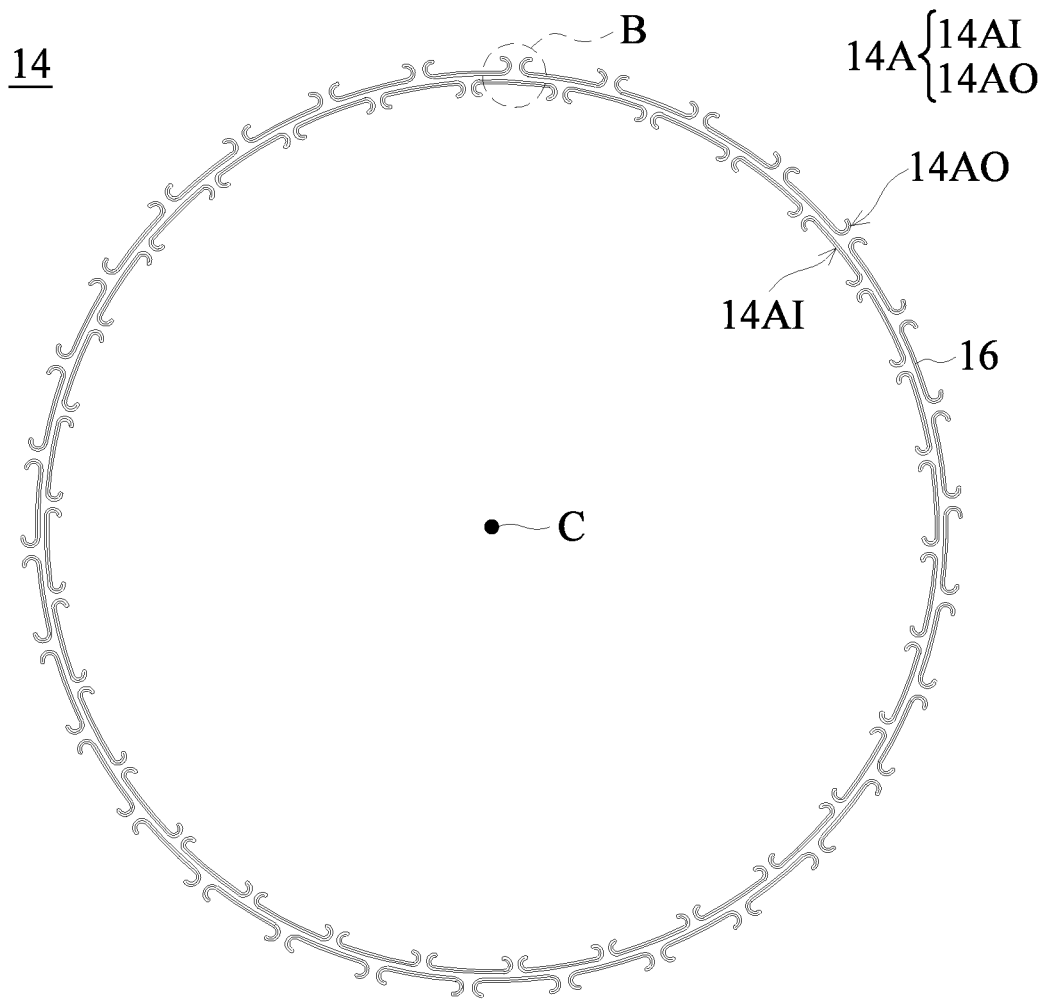
FIG. 2A is a partial top view illustrating the diaphragm (and the filler structure) of the micro-electro-mechanical system (MEMS) microphone according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1A is a partial cross-sectional view illustrating a micro-electro-mechanical system (MEMS) microphone M according to some embodiments of the present disclosure. For example, the MEMS microphone M may be a capacitive microphone. As shown in FIG. 1A, the MEMS microphone M includes a MEMS structure 10. In some embodiments, the MEMS structure 10 includes a substrate 11, a dielectric layer 12, a backplate 13, a diaphragm 14, and an electrode layer 15. It should be noted that some components of the MEMS microphone M (MEMS structure 10) have been omitted in FIG. 1A for sake of brevity.

The substrate 11 is configured to support the dielectric layer 12, the backplate 13, the diaphragm 14, and the electrode layer 15 on one side of the substrate 11. As shown in FIG. 1A, in some embodiments, the substrate 11 has an opening portion 11A. The opening portion 11A allows sound waves received by the MEMS microphone M to pass through and/or enter the MEMS structure 10. For example, the substrate 11 may include silicon or the like, but the present disclosure is not limited thereto.

The dielectric layer 12 is disposed between the substrate 11 and the diaphragm 14, and between the diaphragm 14 and the backplate 13. In other words, the diaphragm 14 is inserted in the dielectric layer 12, so as to provide partial isolation between the substrate 11, the diaphragm 14 and, the backplate 13 from each other. Moreover, the dielectric layer 12 is disposed around the backplate 13 and the diaphragm 14, such that the backplate 13 and the diaphragm 14 are supported at their edges by the dielectric layer 12. The dielectric layer 12 may be made of silicon oxide or the like.

The backplate 13 is a stationary element disposed on one side of the substrate 11. The backplate 13 may have sufficient stiffness such that it would not be bending or movable when the sound waves pass through the backplate 13. For example, the backplate 13 may be a stiff perforated element, but the present disclosure is not limited thereto. As shown in FIG. 1, in some embodiments, the backplate 13 includes a number of acoustic holes 13A, and each acoustic hole 13A passes through the backplate 13. The acoustic holes 13A are configured to allow the sound waves to pass through.

As shown in FIG. 1A, the backplate 13 may include a conductive layer 131 and an insulating layer 132 covering the conductive layer 131 for protection. The insulating layer 132 may further include a first insulating layer 1321 and a second insulating layer 1322. As shown in FIG. 1A, the conductive layer 131 may be disposed on the dielectric layer 12, the first insulating layer 1321 may be disposed on the conductive layer 131, and the second insulating layer 1322 may be disposed on the first insulating layer 1321. For example, the conductive layer 131 may include poly-silicon or the like, and the insulating layer 132 (e.g., the first insulating layer 1321 or the second insulating layer 1322) may include silicon nitride or the like, but the present disclosure is not limited thereto. Moreover, the first insulating layer 1321 and the second insulating layer 1322 may include the same material or different materials.

The MEMS structure 10 may be electrically connected to a circuit (not shown) via several electrode pads of the electrode layer 15 that is disposed on the backplate 13 and electrically connected to the conductive layer 131 and the diaphragm 14. For example, the electrode layer 15 may include copper, silver, gold, aluminum, the like, alloy thereof, or a combination thereof.

The diaphragm 14 is disposed between the substrate 11 and the backplate 13, and extends across the opening portion 11A of the substrate 11. The diaphragm 14 is movable or displaceable relative to the backplate 13. The diaphragm 14 is configured to sense the sound waves received by the MEMS microphone M. As shown in FIG. 1A, in some embodiments, the diaphragm 14 includes ventilation holes 14A, and an air gap G is formed between the diaphragm 14 and the backplate 13. The sound waves pass through the diaphragm 14 via ventilation holes 14A to reach the air gap G, and then pass through the backplate 13 via acoustic hole 13A.

In more detail, the displacement change of the diaphragm 14 relative to the backplate 13 causes a capacitance change between the diaphragm 14 and the backplate 13. The capacitance change is then converted into an electric signal by circuitry connected with the diaphragm 14 and the backplate 13, and the electrical signal is sent out of the MEMS microphone M through the electrode layer 15.

On the other hand, in order to increase the sensitivity of the diaphragm 14, a number of ventilation holes 14A may be provided in the diaphragm 14 to reduce the stiffness of the diaphragm 14. In some embodiments, there may be more than two ventilation holes 14A. With this structural feature, high sensitivity of the MEMS microphone M can be achieved. In addition, the ventilation holes 14A in the diaphragm 14 are also configured to relieve the high air pressure on the diaphragm 14.

Referring to FIG. 1A, in some embodiments, the MEMS structure 10 further includes filler structure 16 disposed on the diaphragm, and a portion of the filler structure 16 is disposed in the ventilation hole 14A. For example, the filler structure 16 may include a conductive material, such as polycrystalline silicon. Alternately, the filler structure 16 may include a dielectric material, such as silicon nitride, but the present disclosure is not limited thereto.

FIG. 1B is a partial enlarged view of region A in FIG. 1A, which may show a portion of the diaphragm 14 and a portion of the filler structure 16. Referring to FIG. 1B, in some embodiments, a gap g is formed between the filler structure 16 and the sidewall of the diaphragm 14. In some embodiments, the gap g is smaller than about 0.3 μm.

For example, the ventilation hole 14A may be a slit that may have a width W14A of about 0.66 μm, and the gap g formed between the filler structure 16 and the sidewall of the diaphragm 14 may be about 0.2 μm. On the other hands, the filler structure 16 may reduce the critical dimension of the slit, which may increase the acoustic resistance, thereby enhancing the signal-to-noise ratio (SNR). Furthermore, the smaller gap g may reduce the variation size of fabrication, thereby decreasing the phase mismatching between MEMS microphones.

FIG. 1C is another partial enlarged view of region A in FIG. 1A, which may show a portion of the diaphragm 14 and a portion of the filler structure 16. Referring to FIG. 1C, in some embodiments, the filler structure 16 forms a dimple portion 162 towards the diaphragm 14. In other words, the filler structure 16 includes a small protrusion (i.e., the position of 162 shown in FIG. 1C) disposed on the filler structure 16 and towards the diaphragm 14, so as to further change the path that the sound waves pass through. As shown in FIG. 1C, there may be one dimple portion 162 on the filler segment 16-1 of the filler structure 16 and another dimple portion 162 on the filler segment 16-2 of the filler structure 16, but the present disclosure is not limited thereto.

As shown in FIG. 1A, FIG. 1B, and FIG. 1C, the filler structure 16 may cover the corresponding ventilation hole 14A. In other words, in some embodiments, from a top view, the area of the filler structure 16 is larger than the area of the corresponding ventilation hole 14A.

Figure 2B:
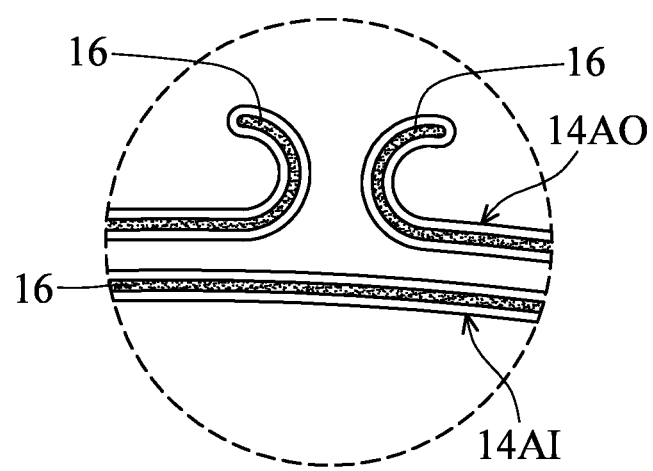
FIG. 2B is a partial enlarged view of region B in FIG. 2A.

FIG. 2A is a partial top view illustrating the diaphragm 14 (and the filler structure 16) of the micro-electro-mechanical system (MEMS) microphone M according to some embodiments of the present disclosure. FIG. 2B is a partial enlarged view of region B in FIG. 2A. It should be noted that FIG. 2A and FIG. 2B merely show the portion of the filler structure 16 that is disposed in the ventilation hole 14A.

Referring to FIG. 2A, in some embodiments, the diaphragm 14 includes a number of ventilation holes 14A, and from a top view of the diaphragm 14 (e.g., FIG. 2A), the ventilation holes 14A are arranged in a ring shape and surround the center C of the diaphragm 14.

As shown in FIG. 2A, in some embodiments, the ventilation holes includes (or are divided into) outer ventilation holes 14AO and inner ventilation holes 14AI, and the outer ventilation holes 14AO and the inner ventilation holes 14AI are arranged in a concentric manner. In the embodiment shown in FIG. 2A, each outer ventilation hole 14AO and each inner ventilation hole 14AI are C-shaped.

As shown in FIG. 2A, in some embodiments, openings of the (C-shaped) outer ventilation holes 14AO face away from the center C of the diaphragm 14, and openings of the (C-shaped) inner ventilation holes 14AI face the center C of the diaphragm 14. For example, the outer ventilation holes 14AO and the inner ventilation holes 14AI may have the same size, and the opening of each outer ventilation hole 14AO and the opening of the corresponding inner ventilation hole 14AI (or corresponding inner ventilation holes 14AI) may face different directions, but the present disclosure is not limited thereto.

Moreover, as shown in FIG. 2A and FIG. 2B, in some embodiments, the outer ventilation holes 14AO and the inner ventilation holes 14AI are staggered relative to the center C of the diaphragm 14, and the filler structure 16 is disposed in both outer ventilation holes 14AO and inner ventilation holes 14AI.

As shown in FIG. 1A (and FIG. 1B), the filler structure 16 includes at least two anchor portions 161 disposed on the diaphragm 14. The anchor portions 161 may be used to support the body of the filler structure 16. For example, the anchor portions 161 may include the same material as the filler structure 16 and be formed by the same processes (e.g., deposition process and/or patterning process) as the filler structure 16, but the present disclosure is not limited thereto.

In some embodiments, from a cross-sectional view of the MEMS structure M, the filler structure 16 is divided into filler segments, and two adjacent filler segments share a common anchor portion 161. Moreover, in some embodiments, the common anchor portion is disposed between the two adjacent filler segments, but the present disclosure is not limited thereto. In some other embodiments, the common anchor portion is disposed outside the two adjacent filler segments.

For example, as shown in FIG. 1B, from a cross-sectional view of the MEMS structure M, the filler structure 16 may include a filler segment 16-1 and a filler segment 16-2 that are adjacent to each other, and the filler segment 16-1 and the filler segment 16-2 may share a common anchor portion 161. Moreover, the common anchor portion 161 is disposed between the filler segment 16-1 and the filler segment 16-2, but the present disclosure is not limited thereto.

It should be noted that the ventilation holes 14A shown in FIG. 1A and FIG. 1B may be outer ventilation holes 14AO and/or inner ventilation holes 14AI. On the other words, in some embodiments, the anchor portions 161 are disposed between the outer ventilation holes 14AO and the inner ventilation holes 14AI. Alternately, in some other embodiments, the anchor portions 161 are disposed inside the inner ventilation holes 14AI, or the anchor portions 161 are disposed outside the outer ventilation holes 14AO.

As shown in FIG. 1A and FIG. 1B, in some embodiments, the anchor portions 161 are in direct contact with the upper surface 14U of the diaphragm 14, but the present disclosure is not limited thereto. In some other embodiments, the anchor portions 161 are in direct contact with the lower surface 14L of the diaphragm 14.

Furthermore, as shown in FIG. 1A, FIG. 1B, and FIG. 2A, in some embodiments, the anchor portions 161 are disposed at the openings of the outer ventilation holes 14AO, and/or the anchor portions 161 are disposed at the openings of the inner ventilation holes 14AI.

Figure 3A:
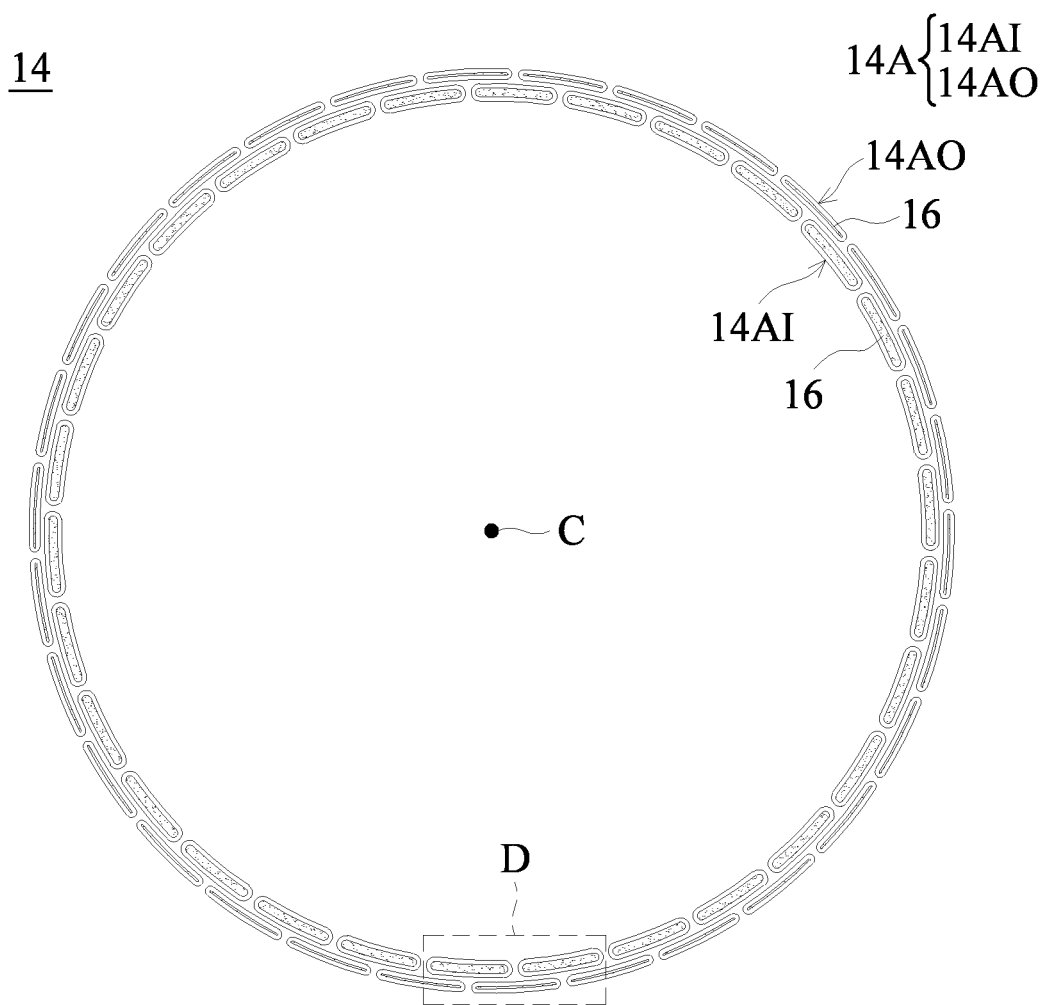
FIG. 3A is a partial top view illustrating the diaphragm (and the filler structure) of the micro-electro-mechanical system (MEMS) microphone according to some other embodiments of the present disclosure.
Figure 3B:
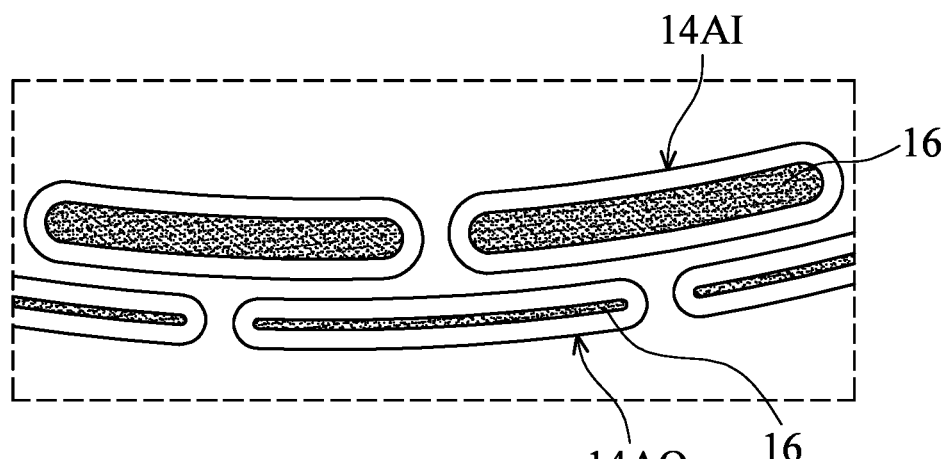
FIG. 3B is a partial enlarged view of region D in FIG. 3A.

FIG. 3A is a partial top view illustrating the diaphragm 14 (and the filler structure 16) of the micro-electro-mechanical system (MEMS) microphone M according to some other embodiments of the present disclosure. FIG. 3B is a partial enlarged view of region D in FIG. 3A. That is, FIG. 3A and FIG. 3B may replace FIG. 2A and FIG. 2B as partial top views of the diaphragm 14 (and the filler structure 16) in FIG. 1A. Similarly, FIG. 3A and FIG. 3B merely show the portion of the filler structure 16 that is disposed in the ventilation hole 14A.

Referring to FIG. 3A, in some embodiments, the diaphragm 14 includes a number of ventilation holes 14A, and from a top view of the diaphragm 14 (e.g., FIG. 3A), the ventilation holes 14A are arranged in a ring shape and surround the center C of the diaphragm 14.

As shown in FIG. 3A, in some embodiments, the ventilation holes includes (or are divided into) outer ventilation holes 14AO and inner ventilation holes 14AI, and the outer ventilation holes 14AO and the inner ventilation holes 14AI are arranged in a concentric manner. In the embodiment shown in FIG. 3A, each outer ventilation hole 14AO and each inner ventilation hole 14AI are strip-shaped, but the outer ventilation hole 14AO and the inner ventilation hole 14AI have the different sizes. For example, the cross-sectional area of the inner ventilation hole 14AI may be larger than the cross-sectional area of the outer ventilation hole 14AO, but the present disclosure is not limited thereto.

Moreover, as shown in FIG. 3A and FIG. 3B, in some embodiments, the outer ventilation holes 14AO and the inner ventilation holes 14AI are staggered relative to the center C of the diaphragm 14, and the filler structure 16 is disposed in both outer ventilation holes 14AO and inner ventilation holes 14AI.

Similarly, the filler structure 16 includes at least two anchor portions 161 (not shown in FIG. 3A and FIG. 3B) disposed on the diaphragm 14. In some embodiments, the anchor portions 161 are disposed between the outer ventilation holes 14AO and the inner ventilation holes 14AI. Alternately, in some other embodiments, the anchor portions 161 are disposed inside the inner ventilation holes 14AI, or the anchor portions 161 are disposed outside the outer ventilation holes 14AO.

Figure 4A:
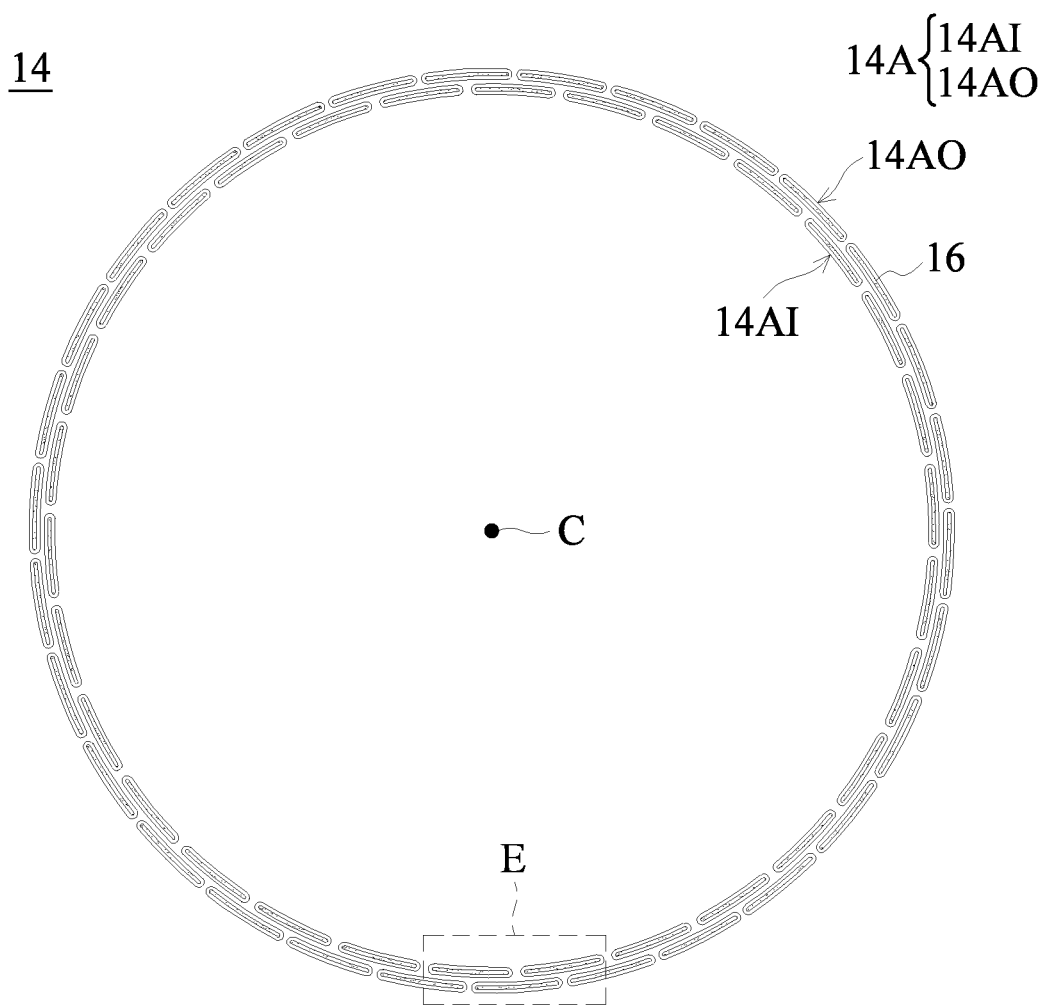
FIG. 4A is a partial top view illustrating the diaphragm (and the filler structure) of the micro-electro-mechanical system (MEMS) microphone according to some other embodiments of the present disclosure.
Figure 4B:
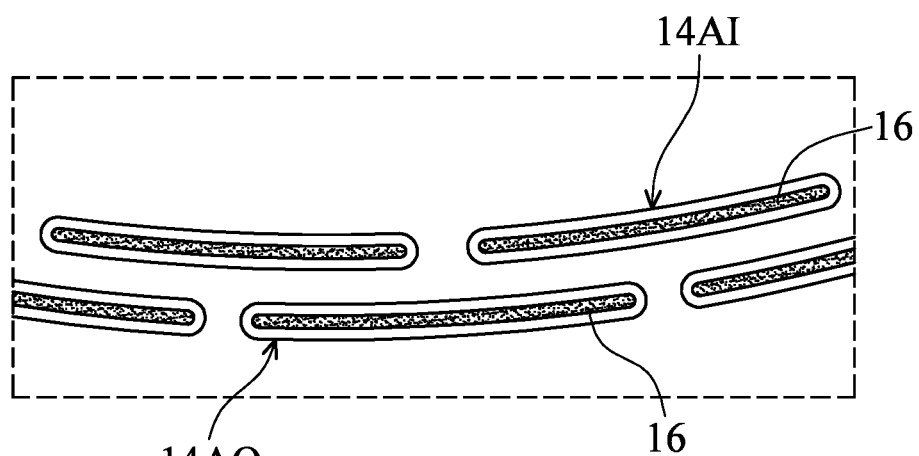
FIG. 4B is a partial enlarged view of region E in FIG. 4A.

FIG. 4A is a partial top view illustrating the diaphragm 14 (and the filler structure 16) of the micro-electro-mechanical system (MEMS) microphone M according to some other embodiments of the present disclosure. FIG. 4B is a partial enlarged view of region E in FIG. 4A. That is, FIG. 4A and FIG. 4B may replace FIG. 2A and FIG. 2B as partial top views of the diaphragm 14 (and the filler structure 16) in FIG. 1A. Similarly, FIG. 4A and FIG. 4B merely show the portion of the filler structure 16 that is disposed in the ventilation hole 14A.

The diaphragm 14 shown in FIG. 4A and FIG. 4B has a similar structure to the diaphragm 14 shown in FIG. 3A and FIG. 3B. The main difference is that the outer ventilation hole 14AO and the inner ventilation hole 14AI shown in FIG. 4A and FIG. 4B have the same size.

Figure 5A:
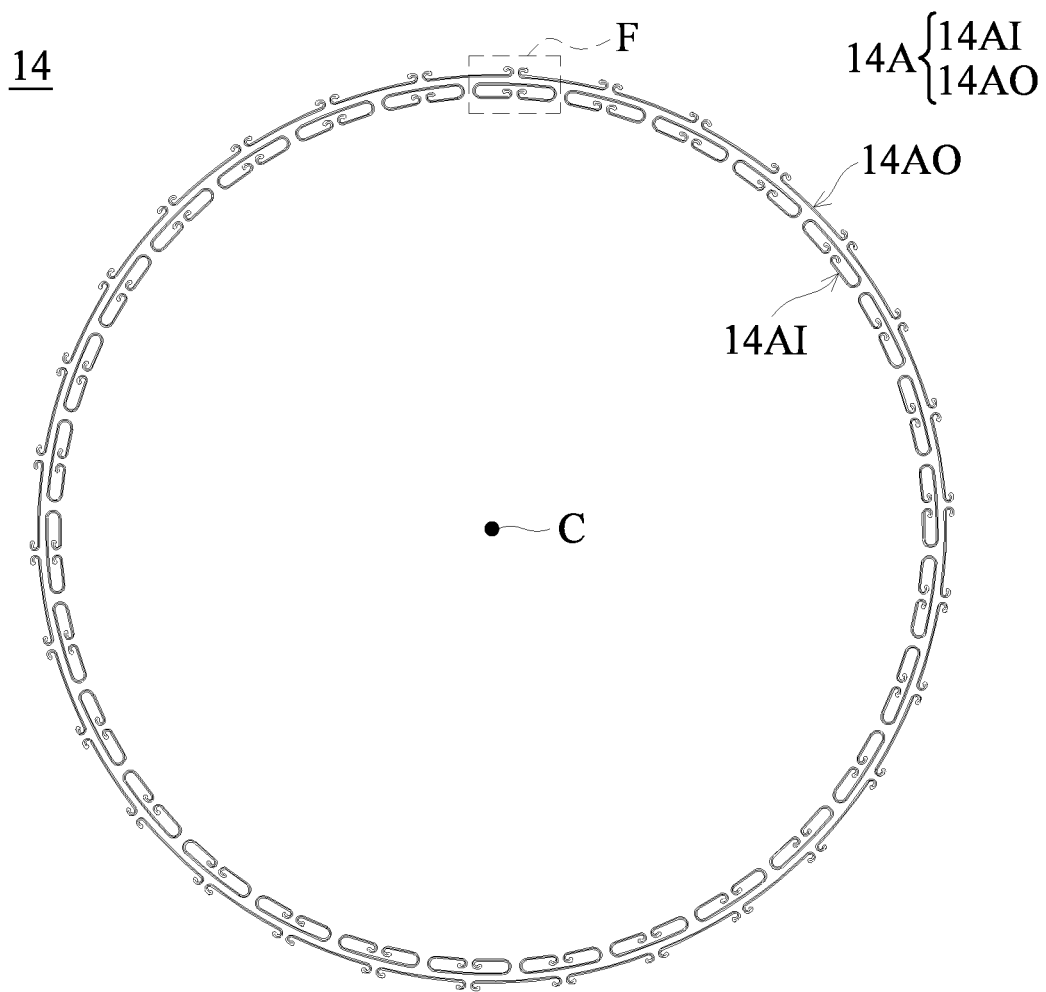
FIG. 5A is a partial top view illustrating the diaphragm (and the filler structure) of the micro-electro-mechanical system (MEMS) microphone according to some other embodiments of the present disclosure.
Figure 5B:
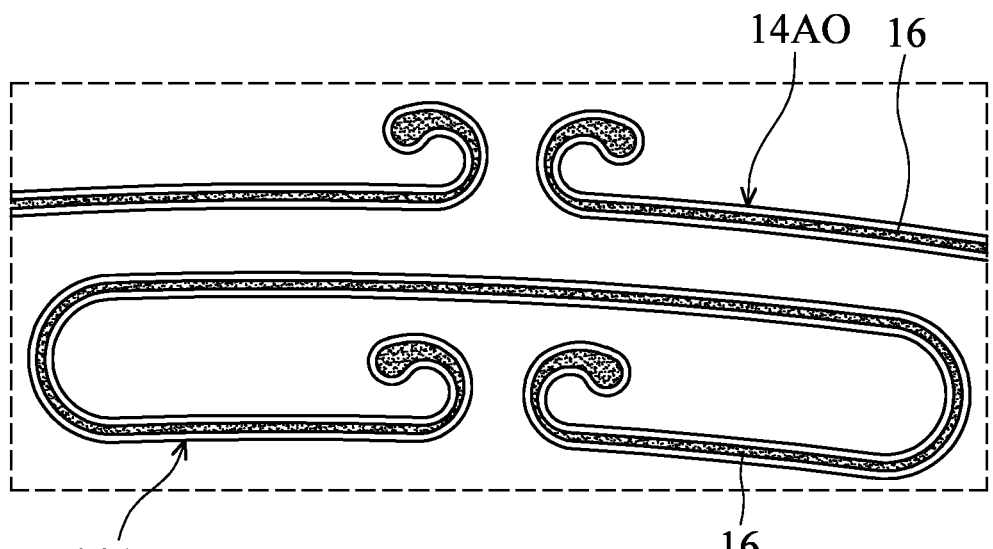
FIG. 5B is a partial enlarged view of region F in FIG. 5A.

FIG. 5A is a partial top view illustrating the diaphragm 14 (and the filler structure 16) of the micro-electro-mechanical system (MEMS) microphone M according to some other embodiments of the present disclosure. FIG. 5B is a partial enlarged view of region F in FIG. 5A. That is, FIG. 5A and FIG. 5B may replace FIG. 2A and FIG. 2B as partial top views of the diaphragm 14 (and the filler structure 16) in FIG. 1A. Similarly, FIG. 5A and FIG. 5B merely show the portion of the filler structure 16 that is disposed in the ventilation hole 14A.

The diaphragm 14 shown in FIG. 5A and FIG. 5B has a similar structure to the diaphragm 14 shown in FIG. 2A and FIG. 2B. As shown in FIG. 5A, in some embodiments, the ventilation holes includes (or are divided into) outer ventilation holes 14AO and inner ventilation holes 14AI, and the outer ventilation holes 14AO and the inner ventilation holes 14AI are arranged in a concentric manner. In the embodiment shown in FIG. 5A, each outer ventilation hole 14AO and each inner ventilation hole 14AI are C-shaped, but the outer ventilation hole 14AO and the inner ventilation hole 14AI have the different sizes.

FIG. 6, FIG. 7, FIG. 8, and FIG. 9 are partial cross-sectional views illustrating a micro-electro-mechanical system (MEMS) microphone M according to some other embodiments of the present disclosure. Similarly, some components of the MEMS microphone M (MEMS structure 10) have been omitted in FIG. 6, FIG. 7, FIG. 8, and FIG. 9 for sake of brevity.

Figure 6:
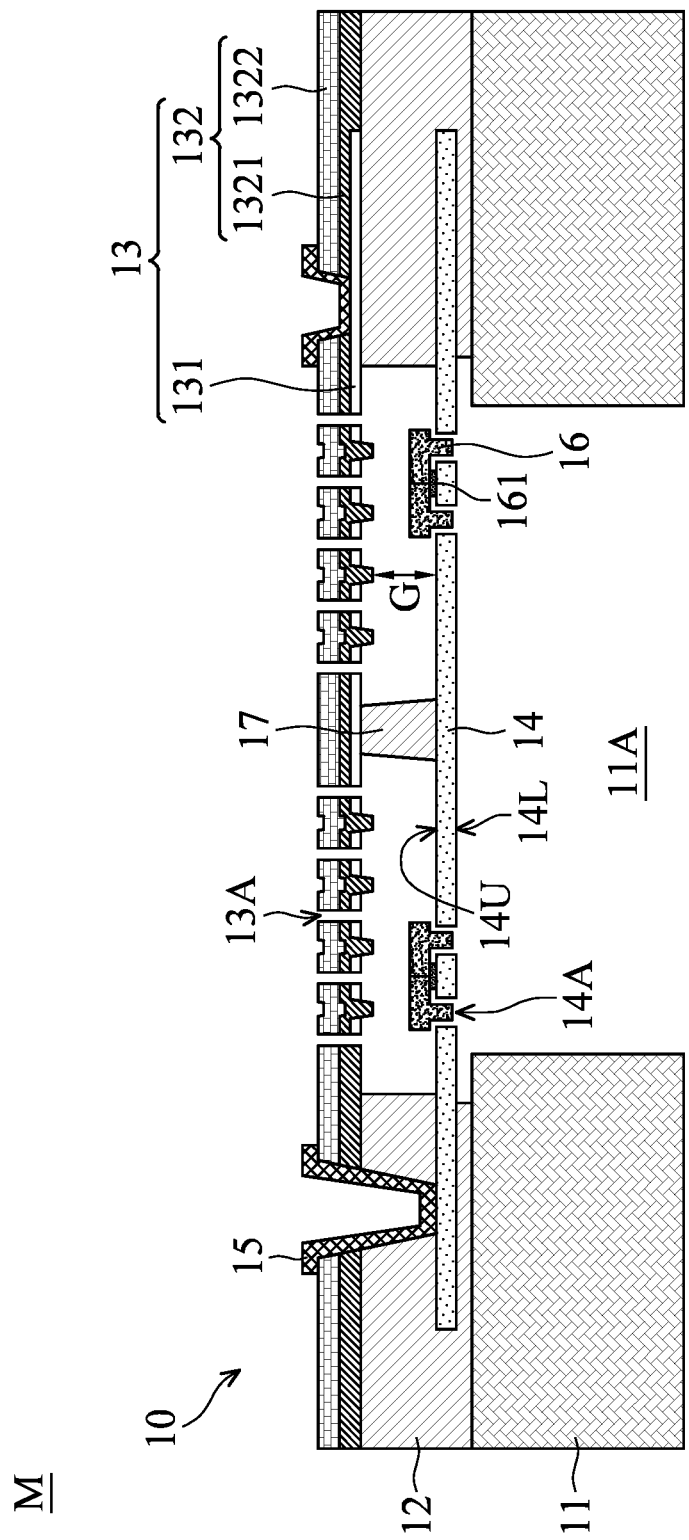
FIG. 6, FIG. 7, FIG. 8, and FIG. 9 are partial cross-sectional views illustrating a micro-electro-mechanical system (MEMS) microphone according to some other embodiments of the present disclosure.

Referring to FIG. 6, the MEMS structure 10 has a similar structure to the MEMS structure 10 shown in FIG. 1A and FIG. 1B. That is, the MEMS structure 10 shown in FIG. 6 includes a substrate 11 having an opening portion 11A and a backplate 13 disposed on one side of the substrate 11 and having acoustic holes 13A. The MEMS structure 10 also includes a diaphragm 14 disposed between the substrate 11 and the backplate 13 and extending across the opening portion 11A of the substrate 11. The diaphragm 14 includes a ventilation hole 14A, and an air gap G is formed between the diaphragm 14 and the backplate 13. The MEMS structure 10 further includes a filler structure 16 disposed in the ventilation hole 14A.

In the embodiment shown in FIG. 6, The MEMS structure 10 further includes a pillar 17 disposed between the backplate 13 and the diaphragm 14. In more detail, the pillar 17 may be in direct contact with the backplate 13 (e.g., the conductive layer 131) and the diaphragm 14. For example, the pillar 17 may include insulating material, such as silicon oxide or the like, but the present disclosure is not limited thereto.

Figure 7:
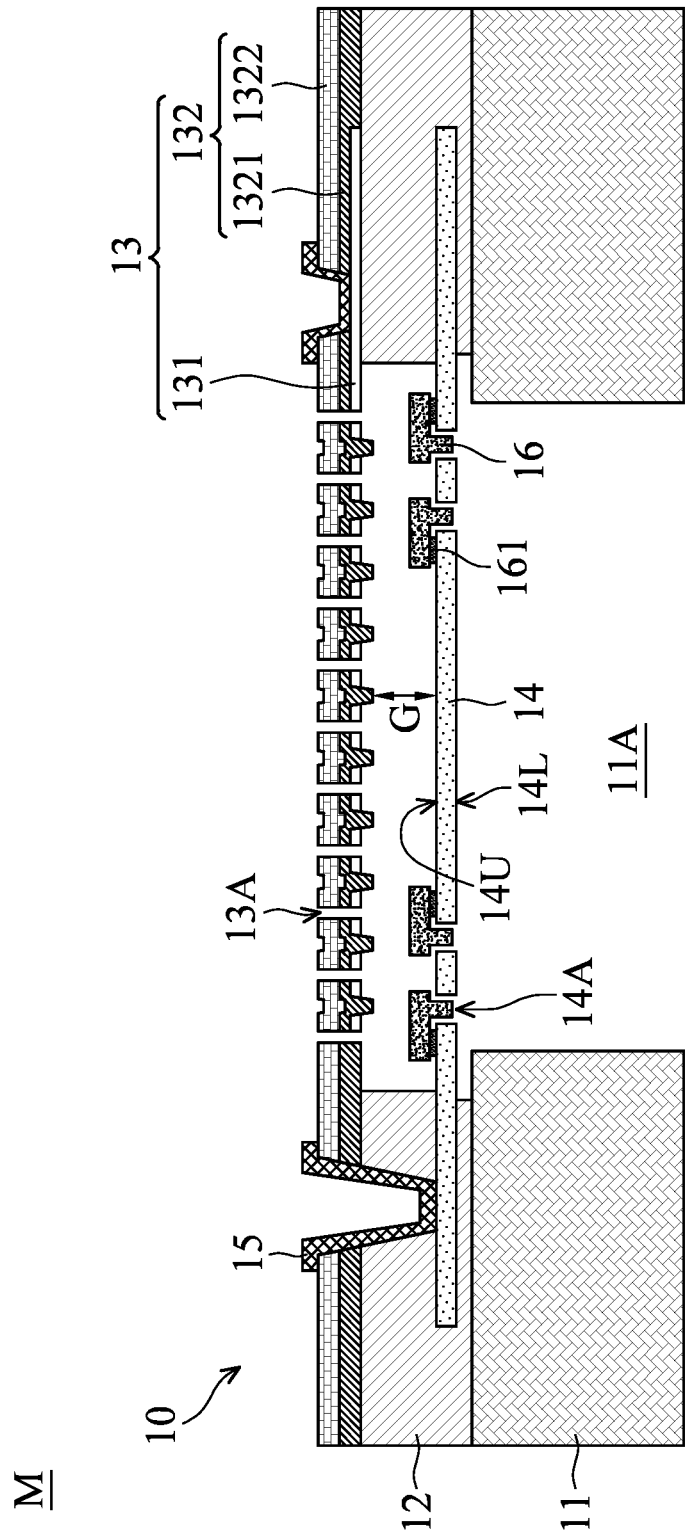

Referring to FIG. 7, the MEMS structure 10 has a similar structure to the MEMS structure 10 shown in FIG. 1A and FIG. 1B. The main difference is that from a cross-sectional view of the MEMS structure M, the filler structure 16 may include (or be divided into) filler segments, and the filler segments may not share a common anchor portion 161. In the embodiments shown in FIG. 7, the anchor portions 161 are disposed on (and in direct contact with) the upper surface 14U of the diaphragm 14. For example, the anchor portions 161 of the filler structure 16 may be disposed inside the inner ventilation holes 14AI or outside the outer ventilation holes 14AO, which may be adjusted depending on actual needs.

Figure 8:
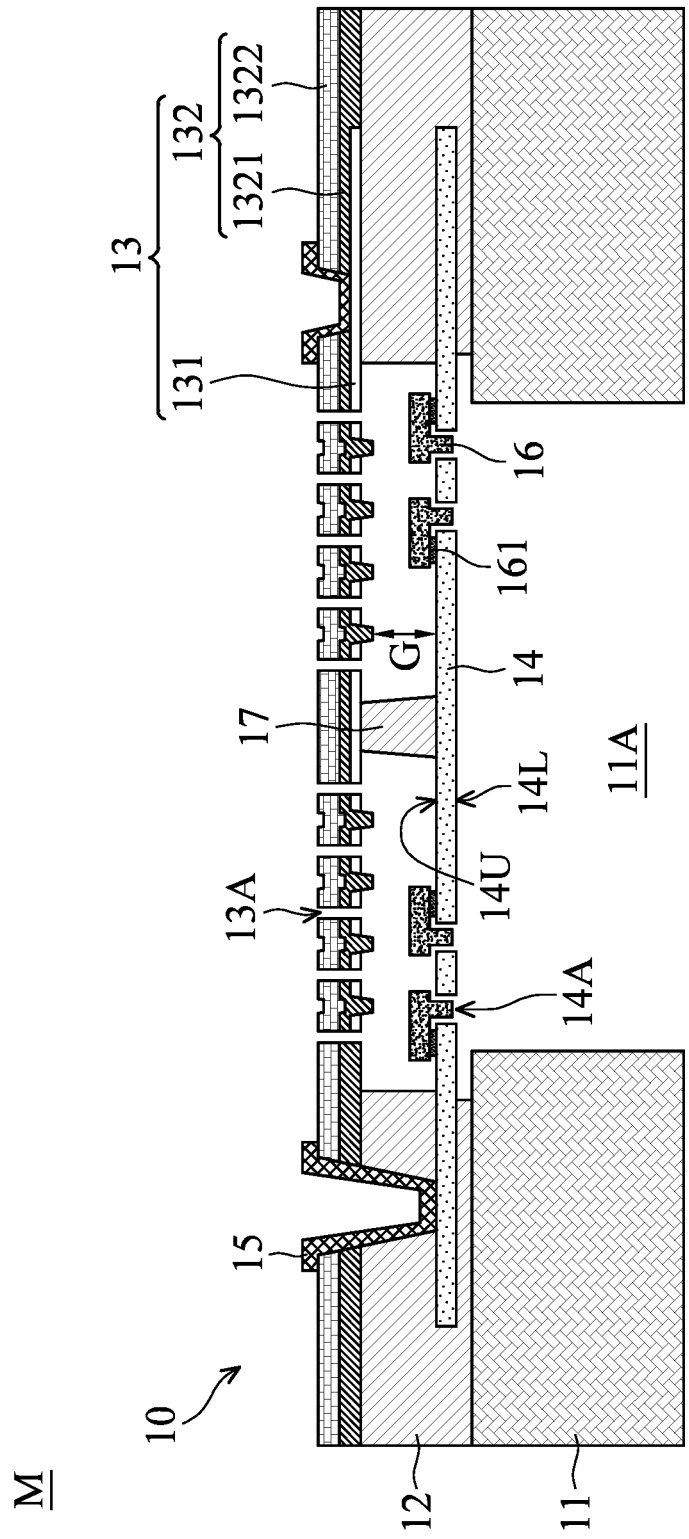
Figure 9:
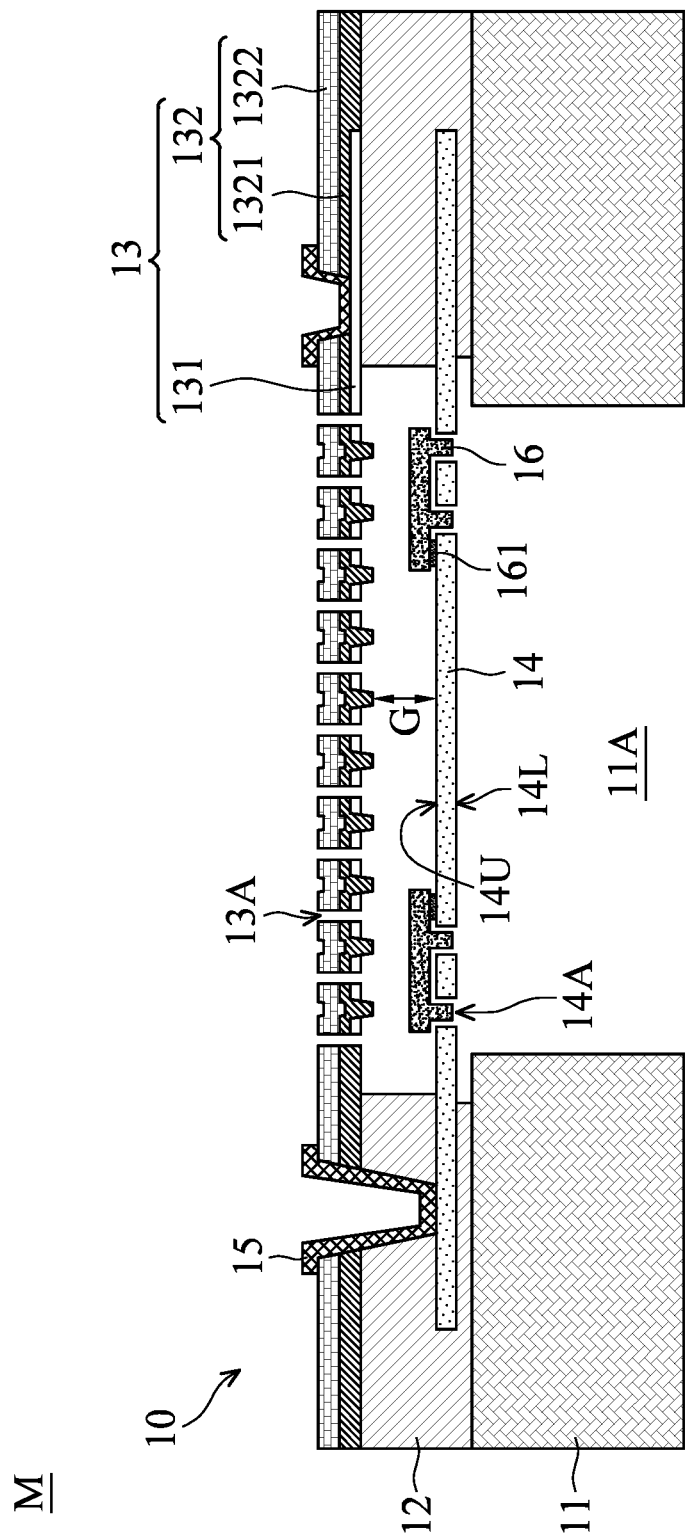

Referring to FIG. 8, the MEMS structure 10 has a similar structure to the MEMS structure 10 shown in FIG. 7. The main difference is that the MEMS structure 10 shown in FIG. 8 further includes a pillar 17 disposed between the backplate 13 and the diaphragm 14. In more detail, the pillar 17 may be in direct contact with the backplate 13 (e.g., the conductive layer 131) and the diaphragm 14, but the present disclosure is not limited thereto.

Referring to FIG. 7, the MEMS structure 10 has a similar structure to the MEMS structure 10 shown in FIG. 1A and FIG. 1B. That is, from a cross-sectional view of the MEMS structure M, the filler structure 16 may include (or be divided into) filler segments, and the filler segments may share a common anchor portion 161. The main difference is that the common anchor portion 161 is not disposed between the filler segments. For example, the common anchor portions 161 may be disposed inside the inner ventilation holes 14AI, but the present disclosure is not limited thereto.

FIG. 10, FIG. 11, FIG. 12, and FIG. 13 are partial cross-sectional views illustrating the connection of anchor portions 161 according to some embodiments of the present disclosure. The connection of anchor portions 161 shown in FIG. 10, FIG. 11, FIG. 12, and FIG. 13 may be applied in the foregoing embodiments. Similarly, some components have been omitted in FIG. 10, FIG. 11, FIG. 12, and FIG. 13 for sake of brevity.

Figure 10:
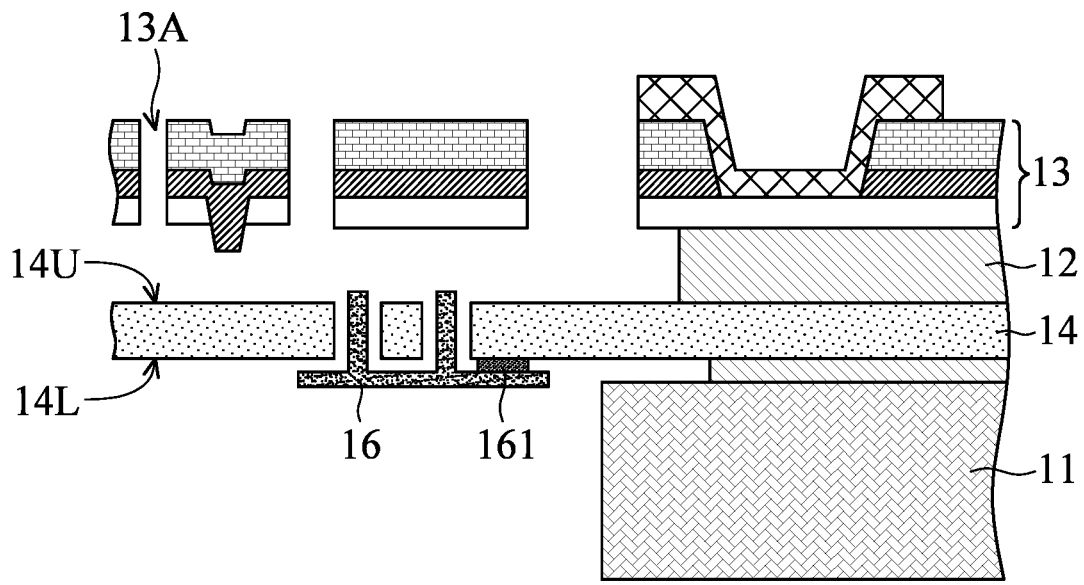
FIG. 10, FIG. 11, FIG. 12, and FIG. 13 are partial cross-sectional views illustrating the connection of anchor portions according to some embodiments of the present disclosure.

Referring to FIG. 10, the filler structure 16 may include (or be divided into) filler segments, and the filler segments may share a common anchor portion 161. In this embodiment, the common anchor portion 161 is disposed on (and in direct contact with) the lower surface 14L of the diaphragm 14. For example, the anchor portion 161 of the filler structure 16 may be disposed outside the outer ventilation holes 14AO, but the present disclosure is not limited thereto.

Figure 11:
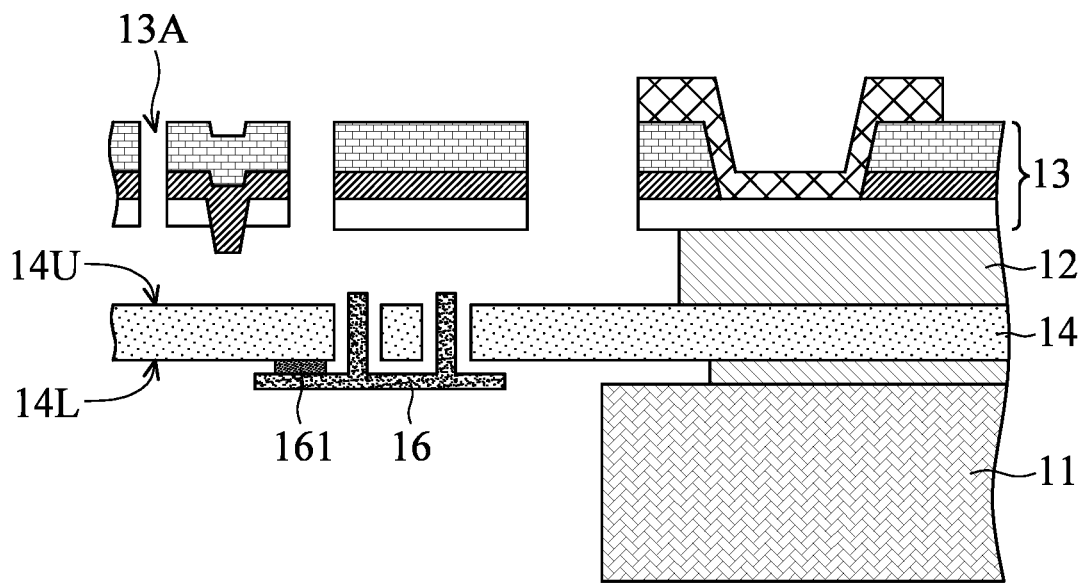

Referring to FIG. 11, the filler structure 16 may include (or be divided into) filler segments, and the filler segments may share a common anchor portion 161. In this embodiment, the common anchor portion 161 is disposed on (and in direct contact with) the lower surface 14L of the diaphragm 14. For example, the anchor portion 161 of the filler structure 16 may be disposed inside the inner ventilation holes 14AI, but the present disclosure is not limited thereto.

Figure 12:
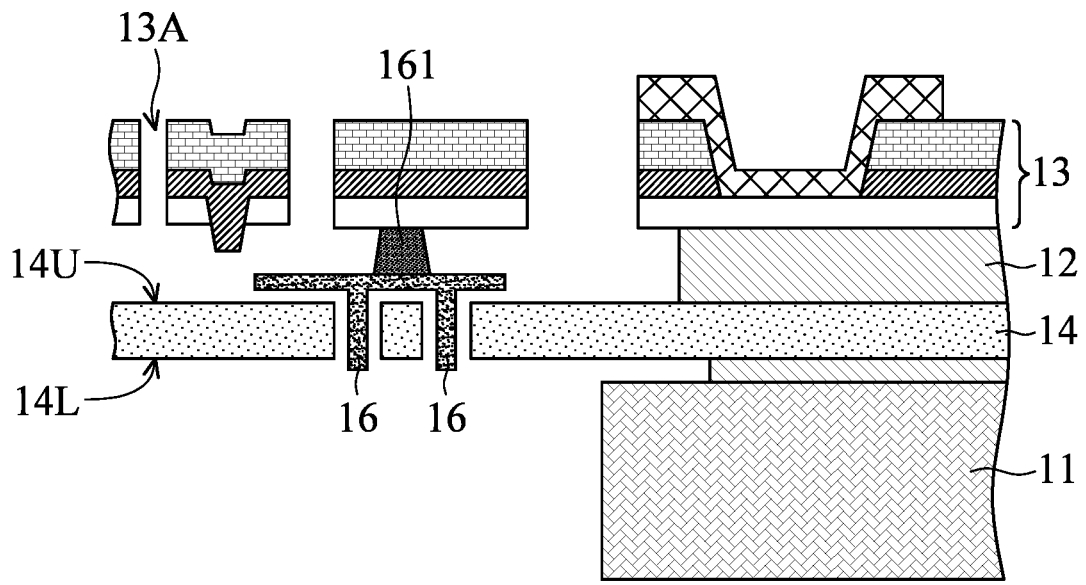

Referring to FIG. 12, the filler structure 16 may include (or be divided into) filler segments, and the filler segments may share a common anchor portion 161. In this embodiment, the common anchor portion 161 is disposed on (and in direct contact with) backplate 13. In other words, the common anchor portion 161 may be disposed between the backplate 13 and the diaphragm 14, but the present disclosure is not limited thereto.

Figure 13:
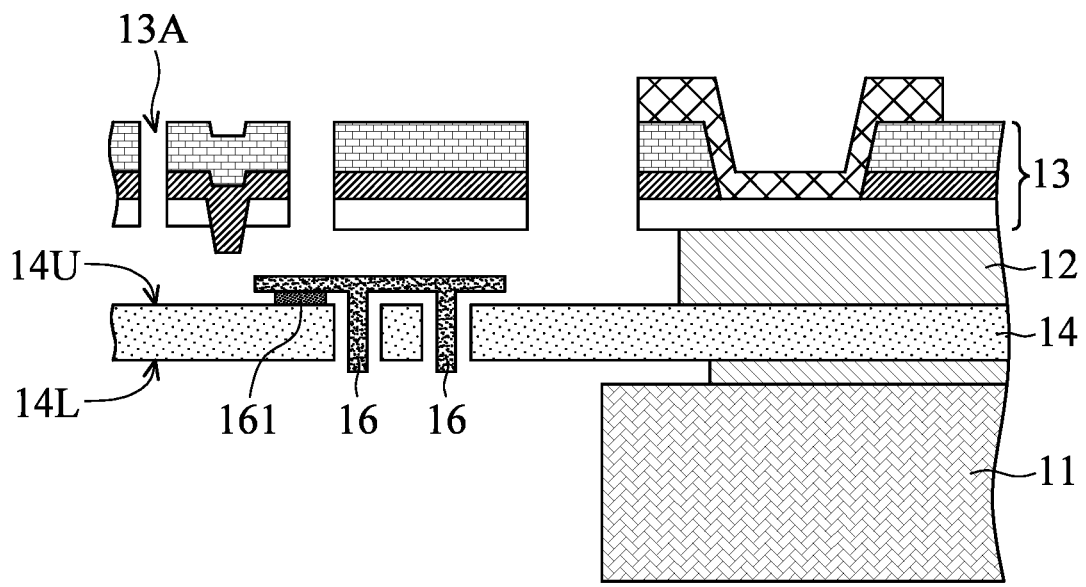

Referring to FIG. 13, the filler structure 16 may include (or be divided into) filler segments, and the filler segments may share a common anchor portion 161. In this embodiment, the common anchor portion 161 is disposed on (and in direct contact with) the upper surface 14U of the diaphragm 14. For example, the anchor portion 161 of the filler structure 16 may be disposed inside the inner ventilation holes 14AI, but the present disclosure is not limited thereto.

Figure 14A:
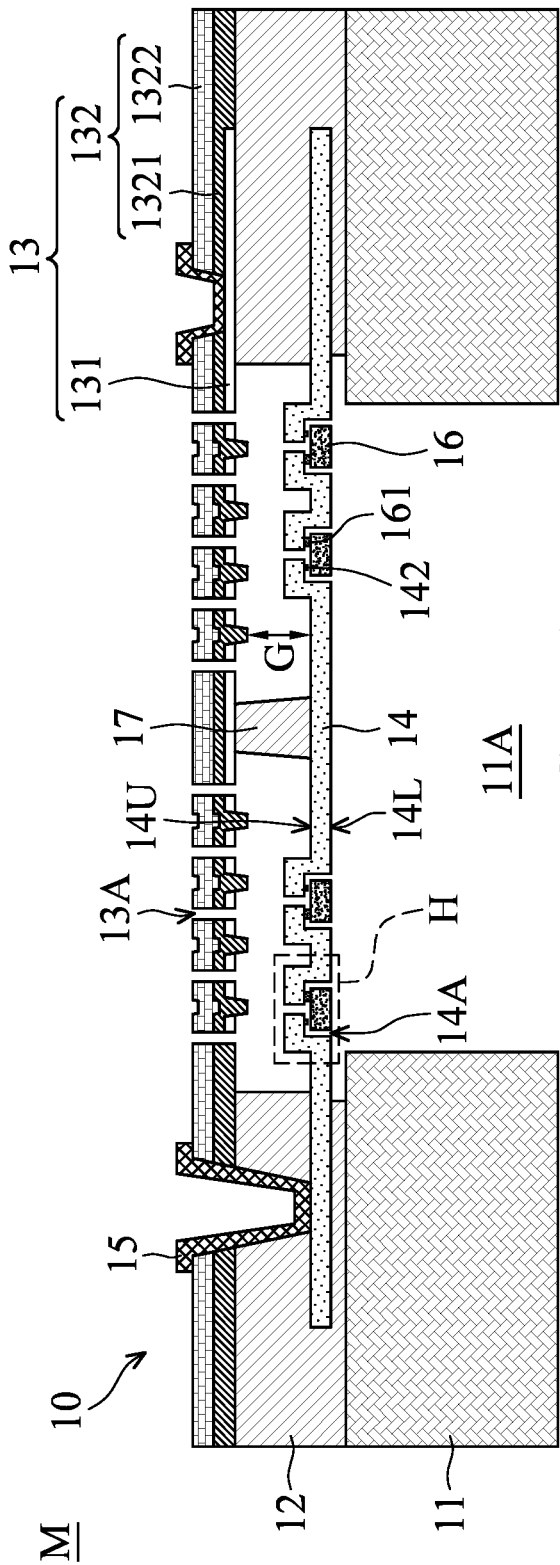
FIG. 14A is a partial cross-sectional view illustrating a micro-electro-mechanical system (MEMS) microphone according to some other embodiments of the present disclosure.
Figure 14B:
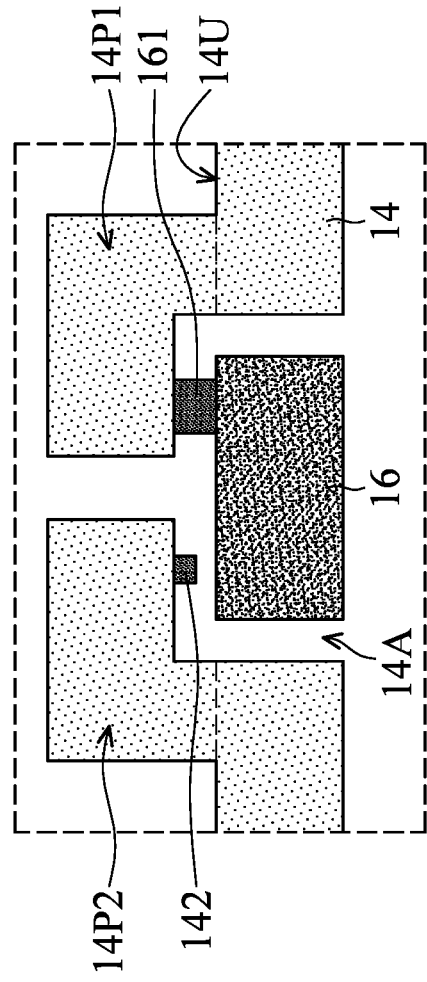
FIG. 14B is a partial enlarged view of region H in FIG. 14A.

FIG. 14A is a partial cross-sectional view illustrating a micro-electro-mechanical system (MEMS) microphone M according to some other embodiments of the present disclosure. FIG. 14B is a partial enlarged view of region H in FIG. 14A, which may show a portion of the diaphragm 14 and a portion of the filler structure 16. Similarly, some components of the MEMS microphone M (MEMS structure 10) have been omitted in FIG. 14A and FIG. 14B for sake of brevity.

Referring to FIG. 14A and FIG. 14B, the MEMS structure 10 has a similar structure to the MEMS structure 10 shown in FIG. 6. In the embodiment shown in FIG. 14A and FIG. 14B, the diaphragm 14 has eaves portions 14P1 and 14P2 from the upper surface 14U of the diaphragm 14 towards the air gap G. In this embodiment, the filler structure 16 is disposed in the ventilation hole 14A and includes anchor portions 161 that connect (or are in direct contact with) the filler structure 16 and the eaves portions 14P1 of the diaphragm 14.

As shown in FIG. 14A and FIG. 14B, in some embodiments, the diaphragm 14 forms a dimple portion 142 towards the filler structure 16. In other words, the diaphragm 14 includes a small protrusion (i.e., the position of 142 shown in FIG. 14B) disposed on the eaves portion 14P2 and towards the filler structure 16, so as to further change the path that the sound waves pass through.

As noted above, in the embodiments of the present disclosure, since the MEMS structure includes a filler structure disposed in the ventilation hole the filler structure may reduce the critical dimension of the ventilation hole (e.g., slit), which may increase the acoustic resistance, thereby enhancing the signal-to-noise ratio (SNR). Furthermore, the smaller gap formed between the filler structure and the sidewall of the diaphragm may reduce the variation size of fabrication, thereby decreasing the phase mismatching between MEMS microphones using the MEMS structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro-electro-mechanical system structure, comprising:
    a substrate having an opening portion;
    a backplate disposed on one side of the substrate and having acoustic holes;
    a diaphragm disposed between the substrate and the backplate, extending across the opening portion of the substrate, and comprising a ventilation hole, wherein an air gap is formed between the diaphragm and the backplate; and
    a filler structure in direct contact with the diaphragm or the backplate, wherein a portion of the filler structure extends from the diaphragm or the backplate into the ventilation hole.

2. The micro-electro-mechanical system structure as claimed in claim 1, wherein a gap is formed between the filler structure and a sidewall of the diaphragm.

3. The micro-electro-mechanical system structure as claimed in claim 2, wherein the gap is smaller than 0.3 μm.

4. The micro-electro-mechanical system structure as claimed in claim 1, wherein the filler structure comprises at least two anchor portions disposed on the diaphragm or comprises an anchor portion disposed on the backplate.

5. The micro-electro-mechanical system structure as claimed in claim 4, wherein the diaphragm comprises ventilation holes, from a top view of the diaphragm, the ventilation holes are arranged in a ring shape and surround a center of the diaphragm, and the ventilation holes comprise outer ventilation holes and inner ventilation holes arranged in a concentric manner.

6. The micro-electro-mechanical system structure as claimed in claim 5, wherein the outer ventilation holes and the inner ventilation holes are staggered relative to the center of the diaphragm.

7. The micro-electro-mechanical system structure as claimed in claim 5, wherein the anchor portions are disposed between the outer ventilation holes and the inner ventilation holes.

8. The micro-electro-mechanical system structure as claimed in claim 5, wherein the anchor portions are disposed inside the inner ventilation holes or outside the outer ventilation holes.

9. The micro-electro-mechanical system structure as claimed in claim 5, wherein each of the outer ventilation holes and the inner ventilation holes are C-shaped, and openings of the outer ventilation holes face away from the center of the diaphragm and openings of the inner ventilation holes face the center of the diaphragms.

10. The micro-electro-mechanical system structure as claimed in claim 9, wherein the anchor portions are disposed at the openings of the outer ventilation holes or at the openings of the inner ventilation holes.

11. The micro-electro-mechanical system structure as claimed in claim 5, wherein the anchor portions are in direct contact with an upper surface or a lower surface of the diaphragm.

12. The micro-electro-mechanical system structure as claimed in claim 5, wherein from a cross-sectional view of the micro-electro-mechanical system structure, the filler structure is divided into filler segments, and two adjacent filler segments share a common anchor portion.

13. The micro-electro-mechanical system structure as claimed in claim 12, wherein the common anchor portion is disposed between the two adjacent filler segments.

14. The micro-electro-mechanical system structure as claimed in claim 12, wherein the common anchor portion is disposed outside the two adjacent filler segments.

15. The micro-electro-mechanical system structure as claimed in claim 1, wherein the filler structure forms a dimple portion towards the diaphragm.

16. He micro-electro-mechanical system structure as claimed in claim 1, further comprising:
    a pillar disposed between the backplate and the diaphragm.

17. The micro-electro-mechanical system structure as claimed in claim 1, wherein from a top view, an area of the filler structure is larger than an area of the ventilation hole.

18. A micro-electro-mechanical system structure, comprising:
- a substrate having an opening portion;
- a backplate disposed on one side of the substrate and having acoustic holes;
- a diaphragm disposed between the substrate and the backplate, extending across the opening portion of the substrate, and comprising a ventilation hole, wherein an air gap is formed between the diaphragm and the backplate; and
- a filler structure disposed in the ventilation hole and comprising at least two anchor portions disposed on the diaphragm,
- wherein the diaphragm has eaves portions from an upper surface of the diaphragm towards the air gap, and the anchor portions connect the filler structure and at least one of the eaves portions.

19. The micro-electro-mechanical system structure as claimed in claim 18, wherein a gap is formed between the filler structure and a sidewall of the diaphragm.

20. The micro-electro-mechanical system structure as claimed in claim 18, wherein the diaphragm forms a dimple portion towards the filler structure.

* * * * *